United States Patent
Benaissa et al.

(10) Patent No.: US 11,401,162 B2
(45) Date of Patent: Aug. 2, 2022

(54) METHOD FOR TRANSFERRING A USEFUL LAYER INTO A SUPPORTING SUBSTRATE

(71) Applicant: Commissariat a l'energie atomique et aux energies alternatives, Paris (FR)

(72) Inventors: Lamine Benaissa, Grenoble (FR); Thierry Salvetat, Voiron (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 197 days.

(21) Appl. No.: 16/223,857

(22) Filed: Dec. 18, 2018

(65) Prior Publication Data
US 2019/0202688 A1  Jul. 4, 2019

(30) Foreign Application Priority Data

Dec. 28, 2017 (FR) ...................... 17 63342

(51) Int. Cl.
*H01L 21/762* (2006.01)
*H01L 29/16* (2006.01)
(Continued)

(52) U.S. Cl.
CPC .... *B81C 1/00507* (2013.01); *H01L 21/76254* (2013.01); *H01L 41/312* (2013.01);
(Continued)

(58) Field of Classification Search
CPC ........ B81C 1/00507; B81C 2201/0116; H01L 21/76254; H01L 41/312; H01L 29/16;
(Continued)

(56) References Cited

U.S. PATENT DOCUMENTS 4,177,084 A * 12/1979 Lau ........................ C30B 25/18
117/8
4,509,990 A * 4/1985 Vasudev ............. H01L 21/0242
438/155
(Continued)

FOREIGN PATENT DOCUMENTS

EP  2 224 476 A1  9/2010

OTHER PUBLICATIONS

C.-H. Yun et al., "Fabrication of Silicon and Oxide Membranes Over Cavities Using Ion-Cut Layer Transfer", Journal of Microelectromechanical Systems, vol. 9, No. 4, 474-477 (Year: 2000).*
(Continued)

*Primary Examiner* — Duy T Nguyen
(74) *Attorney, Agent, or Firm* — Oblon, McClelland, Maier & Neustadt, L.L.P.

(57) ABSTRACT

A process for transferring a useful layer to a carrier substrate including a first surface is provided, the process including the steps of: providing a donor substrate including a first surface, a weakened zone including implanted species, the useful layer, which is bounded by the weakened zone and by the first surface of the donor substrate, and an amorphous zone disposed, in the useful layer, parallel to the weakened zone; assembling, on a side of the first surface of the donor substrate and on a side of the first surface of the carrier substrate, the donor substrate with the carrier substrate by bonding, such that the amorphous zone is at least partially facing at least one cavity that is partially bounded by the first surface of the donor substrate; and splitting the donor substrate along the weakened zone so as to reveal the useful layer.

22 Claims, 5 Drawing Sheets

(51) Int. Cl.
  *H01L 29/20* (2006.01)
  *B81C 1/00* (2006.01)
  *H01L 41/312* (2013.01)
  *H01L 41/187* (2006.01)

(52) U.S. Cl.
  CPC ....... *B81C 2201/0116* (2013.01); *H01L 29/16* (2013.01); *H01L 29/20* (2013.01); *H01L 29/2003* (2013.01); *H01L 41/1873* (2013.01)

(58) Field of Classification Search
  CPC .. H01L 29/20; H01L 29/2003; H01L 41/1873
  USPC ........................................................ 438/458
  See application file for complete search history.

(56) References Cited

U.S. PATENT DOCUMENTS

| | | | | |
|---|---|---|---|---|
| 5,623,099 A * | 4/1997 | Schuster | ............. | G01P 15/0802 73/514.32 |
| 6,191,007 B1 * | 2/2001 | Matsui | ............. | H01L 21/76243 438/459 |
| 6,245,618 B1 * | 6/2001 | An | ............. | H01L 21/26506 438/289 |
| 6,352,909 B1 * | 3/2002 | Usenko | ............. | H01L 21/2236 438/458 |
| 6,451,668 B1 * | 9/2002 | Neumeier | ............. | B81C 1/00126 438/401 |
| 6,459,141 B2 * | 10/2002 | Yu | ............. | H01L 21/26506 257/611 |
| 6,806,147 B1 * | 10/2004 | Yu | ............. | H01L 21/26506 438/289 |
| 6,902,962 B2 * | 6/2005 | Yeo | ............. | H01L 21/84 257/369 |
| 6,908,828 B2 * | 6/2005 | Letertre | ............. | H01L 21/2007 257/E21.122 |
| 6,958,255 B2 * | 10/2005 | Khuri-Yakub | ............. | B06B 1/0688 438/118 |
| 6,991,995 B2 * | 1/2006 | Aulnette | ............. | H01L 21/76259 257/E21.568 |
| 7,104,129 B2 * | 9/2006 | Nasiri | ............. | B81C 1/0023 73/504.04 |
| 7,221,038 B2 * | 5/2007 | Auberton-Herve | ............. | H01L 21/76254 257/618 |
| 7,247,246 B2 * | 7/2007 | Nasiri | ............. | B81C 1/00238 216/2 |
| 7,250,353 B2 * | 7/2007 | Nasiri | ............. | B81C 1/00333 257/499 |
| 7,318,349 B2 * | 1/2008 | Vaganov | ............. | G01P 15/123 73/514.33 |
| 7,348,257 B2 * | 3/2008 | Barlocchi | ............. | H01L 21/76251 257/E21.238 |
| 7,387,947 B2 * | 6/2008 | Cayrefourcq | ............. | H01L 21/76254 257/E21.568 |
| 7,494,897 B2 * | 2/2009 | Fournel | ............. | H01L 21/187 257/E21.499 |
| 7,625,776 B2 * | 12/2009 | Wells | ............. | H01L 21/3065 216/58 |
| 7,709,305 B2 * | 5/2010 | Aspar | ............. | B81C 1/00357 438/150 |
| 7,799,651 B2 * | 9/2010 | Mazure | ............. | H01L 21/26506 438/311 |
| 7,825,016 B2 * | 11/2010 | Giles | ............. | H01L 21/26506 438/528 |
| 7,842,564 B2 * | 11/2010 | Mizushima | ............. | H01L 21/84 438/166 |
| 8,044,465 B2 * | 10/2011 | Aspar | ............. | H01L 21/0254 257/354 |
| 8,138,556 B2 * | 3/2012 | Caplet | ............. | B81C 1/00944 257/401 |
| 8,207,048 B2 * | 6/2012 | Fournel | ............. | H01L 21/76254 438/459 |
| 8,318,555 B2 * | 11/2012 | Signamarcheix | ............. | H01L 21/76254 438/166 |
| 8,349,660 B2 * | 1/2013 | Delapierre | ............. | B81C 1/00293 438/124 |
| 8,563,345 B2 * | 10/2013 | Adler | ............. | G01N 29/2406 438/50 |
| 8,590,136 B2 * | 11/2013 | Yang | ............. | H04R 19/005 29/594 |
| 8,664,742 B2 * | 3/2014 | Wells | ............. | H01L 21/76283 257/510 |
| 8,735,199 B2 * | 5/2014 | Supino | ............. | B81C 1/00523 438/50 |
| 8,841,202 B2 * | 9/2014 | Fournel | ............. | H01L 21/76254 438/458 |
| 8,847,337 B2 * | 9/2014 | Yazdi | ............. | G01C 21/166 257/415 |
| 8,884,725 B2 * | 11/2014 | Stephanou | ............. | H01P 7/065 333/202 |
| 8,975,984 B2 * | 3/2015 | Huang | ............. | B81B 3/0027 333/186 |
| 8,987,114 B2 * | 3/2015 | Mazure | ............. | H01L 21/187 438/455 |
| 9,061,318 B2 * | 6/2015 | Rothberg | ............. | H01L 29/84 |
| 9,067,779 B1 * | 6/2015 | Rothberg | ............. | B81B 7/007 |
| 9,099,526 B2 * | 8/2015 | Or-Bach | ............. | H01L 23/544 |
| 9,111,996 B2 * | 8/2015 | Colinge | ............. | H01L 21/02524 |
| 9,132,450 B2 * | 9/2015 | Huang | ............. | B06B 1/0238 |
| 9,187,316 B2 * | 11/2015 | Chowdhury | ............. | B81C 1/00269 |
| 9,212,049 B2 * | 12/2015 | Yoshikawa | ............. | H01L 29/16 |
| 9,242,275 B2 * | 1/2016 | Rothberg | ............. | B81B 7/007 |
| 9,290,375 B2 * | 3/2016 | Rothberg | ............. | B06B 1/0292 |
| 9,330,958 B2 * | 5/2016 | Gaudin | ............. | H01L 21/02238 |
| 9,351,706 B2 * | 5/2016 | Rothberg | ............. | A61B 8/4477 |
| 9,394,161 B2 * | 7/2016 | Cheng | ............. | B81B 7/007 |
| 9,394,162 B2 * | 7/2016 | Rothberg | ............. | B81C 1/00301 |
| 9,499,392 B2 * | 11/2016 | Rothberg | ............. | G10K 9/12 |
| 9,499,395 B2 * | 11/2016 | Rothberg | ............. | B06B 1/0292 |
| 9,502,558 B2 * | 11/2016 | Reboh | ............. | H01L 21/02532 |
| 9,533,873 B2 * | 1/2017 | Rothberg | ............. | B06B 1/02 |
| 9,592,030 B2 * | 3/2017 | Rothberg | ............. | A61B 8/4483 |
| 9,718,098 B2 * | 8/2017 | Rothberg | ............. | B06B 1/02 |
| 9,728,452 B2 * | 8/2017 | Airaksinen | ............. | H01L 21/28556 |
| 9,738,514 B2 * | 8/2017 | Rothberg | ............. | B81B 7/007 |
| 9,895,718 B2 * | 2/2018 | Rothberg | ............. | B06B 1/0292 |
| 9,910,017 B2 * | 3/2018 | Rothberg | ............. | A61B 8/4483 |
| 9,910,018 B2 * | 3/2018 | Rothberg | ............. | A61B 8/4483 |
| 9,911,641 B2 * | 3/2018 | Boedt | ............. | H01L 22/12 |
| 9,935,191 B2 * | 4/2018 | Jun | ............. | H01L 21/7806 |
| 9,944,514 B2 * | 4/2018 | Rothberg | ............. | B06B 1/02 |
| 10,043,797 B2 * | 8/2018 | Jun | ............. | H01L 28/00 |
| 10,228,353 B2 * | 3/2019 | Rothberg | ............. | B06B 1/0292 |
| 10,247,708 B2 * | 4/2019 | Rothberg | ............. | B81C 1/00238 |
| 10,266,401 B2 * | 4/2019 | Rothberg | ............. | B06B 1/0292 |
| 10,272,470 B2 * | 4/2019 | Rothberg | ............. | G10K 11/18 |
| 10,446,700 B2 * | 10/2019 | Wang | ............. | H04B 10/25 |
| 10,518,292 B2 * | 12/2019 | Rothberg | ............. | B81B 3/0021 |
| 10,629,468 B2 * | 4/2020 | Yota | ............. | H01L 23/5226 |
| 10,710,873 B2 * | 7/2020 | Rothberg | ............. | B81C 1/00158 |
| 2003/0032210 A1 * | 2/2003 | Takayama | ............. | H01L 29/24 438/455 |
| 2004/0085858 A1 * | 5/2004 | Khuri-Yakub | ............. | B06B 1/0688 367/181 |
| 2004/0091201 A1 * | 5/2004 | Divoux | ............. | G02B 26/004 385/18 |
| 2004/0152272 A1 * | 8/2004 | Fladre | ............. | H01L 29/42384 438/284 |
| 2004/0195646 A1 * | 10/2004 | Yeo | ............. | H01L 21/84 257/527 |
| 2004/0248380 A1 * | 12/2004 | Aulnette | ............. | H01L 21/76254 438/459 |
| 2005/0116290 A1 * | 6/2005 | de Souza | ............. | H01L 27/1203 257/347 |
| 2005/0151155 A1 * | 7/2005 | Auberton-Herve | ............. | H01L 21/02002 257/103 |

(56) References Cited

U.S. PATENT DOCUMENTS

| | | | |
|---|---|---|---|
| 2005/0166677 A1* | 8/2005 | Nasiri | H01H 59/0009 73/514.16 |
| 2005/0170656 A1* | 8/2005 | Nasiri | B81C 1/00238 438/700 |
| 2006/0063352 A1* | 3/2006 | Barlocchi | H01L 21/76251 438/455 |
| 2006/0099779 A1* | 5/2006 | Cayrefourcq | H01L 21/76254 438/486 |
| 2006/0118817 A1 | 6/2006 | Haisma | |
| 2006/0166461 A1* | 7/2006 | Fournel | H01L 21/187 438/455 |
| 2006/0228831 A1* | 10/2006 | Nasiri | B81C 1/00333 438/113 |
| 2006/0272413 A1* | 12/2006 | Vaganov | G01P 15/18 73/514.01 |
| 2007/0018266 A1* | 1/2007 | Dupont | H01L 27/14634 257/440 |
| 2007/0032040 A1* | 2/2007 | Lederer | H01P 3/006 438/455 |
| 2007/0161219 A1* | 7/2007 | Giles | H01L 21/2658 438/530 |
| 2007/0200144 A1* | 8/2007 | Aspar | H01L 21/0254 257/194 |
| 2007/0228378 A1* | 10/2007 | Fournel | H01L 21/2007 257/72 |
| 2008/0296708 A1* | 12/2008 | Wodnicki | G01N 29/2406 257/414 |
| 2009/0014720 A1* | 1/2009 | Mazure | H01L 21/26506 257/52 |
| 2009/0014828 A1* | 1/2009 | Mizushima | H01L 27/115 257/506 |
| 2009/0152980 A1* | 6/2009 | Huang | G01N 29/2406 310/309 |
| 2009/0261431 A1* | 10/2009 | Caplet | B81C 1/00944 257/418 |
| 2010/0176397 A1* | 7/2010 | Aspar | B81C 1/00357 257/49 |
| 2010/0190301 A1* | 7/2010 | Delapierre | G01P 1/023 438/124 |
| 2010/0221891 A1 | 9/2010 | Fournel et al. | |
| 2011/0075865 A1* | 3/2011 | Yang | B81C 1/00182 381/174 |
| 2012/0013218 A1* | 1/2012 | Huang | H02N 1/006 310/300 |
| 2012/0091587 A1* | 4/2012 | Or-Bach | H01L 23/49827 257/741 |
| 2012/0187508 A1* | 7/2012 | Adler | G01N 29/2406 257/416 |
| 2012/0286380 A1* | 11/2012 | Yazdi | G01P 15/18 257/415 |
| 2013/0015442 A1* | 1/2013 | Mazure | H01L 27/0688 257/52 |
| 2013/0277675 A1* | 10/2013 | Yoshikawa | H01L 23/26 257/49 |
| 2013/0278359 A1* | 10/2013 | Stephanou | H01P 1/2088 333/232 |
| 2013/0278998 A1* | 10/2013 | Stephanou | H01P 1/2088 359/346 |
| 2014/0057382 A1* | 2/2014 | Supino | B81C 1/00619 438/50 |
| 2014/0061867 A1* | 3/2014 | Airaksinen | H01L 21/28556 257/621 |
| 2014/0084290 A1* | 3/2014 | Allibert | H01L 21/02052 438/479 |
| 2014/0217478 A1* | 8/2014 | Rothberg | B06B 1/02 257/254 |
| 2014/0219062 A1* | 8/2014 | Rothberg | B81B 7/0077 367/135 |
| 2014/0264660 A1* | 9/2014 | Rothberg | G01N 29/2406 257/416 |
| 2014/0346639 A1* | 11/2014 | Boedt | H01L 22/12 257/617 |
| 2015/0032002 A1* | 1/2015 | Rothberg | A61B 8/4488 600/440 |
| 2015/0044807 A1* | 2/2015 | Chowdhury | B06B 1/0292 438/51 |
| 2015/0080724 A1* | 3/2015 | Rothberg | A61B 8/14 600/439 |
| 2015/0084053 A1* | 3/2015 | Rothberg | B81C 1/00301 257/57 |
| 2015/0102471 A1* | 4/2015 | Colinge | H01L 21/02381 257/629 |
| 2015/0132923 A1* | 5/2015 | Gaudin | H01L 21/02592 438/459 |
| 2015/0251896 A1* | 9/2015 | Rothberg | B81C 1/00301 257/416 |
| 2016/0009544 A1* | 1/2016 | Rothberg | B81B 3/0021 257/737 |
| 2016/0009549 A1* | 1/2016 | Rothberg | A61B 8/4483 438/51 |
| 2016/0086974 A1* | 3/2016 | Sadaka | H01L 27/092 257/351 |
| 2016/0137492 A1* | 5/2016 | Cheng | B81C 1/00238 257/415 |
| 2016/0197006 A1* | 7/2016 | Broekaart | H01L 23/544 438/401 |
| 2016/0207760 A1* | 7/2016 | Rothberg | B06B 1/02 |
| 2016/0264400 A1* | 9/2016 | Rothberg | B81B 7/0077 |
| 2016/0280538 A1* | 9/2016 | Rothberg | A61B 8/4483 |
| 2016/0290969 A1* | 10/2016 | Rothberg | G01N 29/2406 |
| 2016/0290970 A1* | 10/2016 | Rothberg | A61B 8/4483 |
| 2017/0025412 A1* | 1/2017 | Jun | H01L 21/823885 |
| 2017/0029271 A1* | 2/2017 | Rothberg | G01N 29/2406 |
| 2017/0056926 A1* | 3/2017 | Rothberg | G10K 11/18 |
| 2017/0077281 A1* | 3/2017 | Jun | H01L 29/045 |
| 2017/0143306 A1* | 5/2017 | Rothberg | A61B 8/56 |
| 2017/0178950 A1* | 6/2017 | Batude | H01L 21/76254 |
| 2017/0186770 A1* | 6/2017 | Or-Bach | H01L 27/092 |
| 2017/0225196 A1* | 8/2017 | Rothberg | B81B 7/0077 |
| 2017/0236742 A1* | 8/2017 | Yota | H01L 23/585 257/774 |
| 2017/0258443 A1* | 9/2017 | Rothberg | A61B 8/13 |
| 2017/0283254 A1* | 10/2017 | Rothberg | G01N 29/2406 |
| 2017/0303897 A1* | 10/2017 | Rothberg | A61B 8/5207 |
| 2017/0315099 A1* | 11/2017 | Rothberg | B06B 1/0292 |
| 2017/0363424 A1* | 12/2017 | Maspero | H01G 5/14 |
| 2018/0102442 A1* | 4/2018 | Wang | H01L 31/02 |
| 2018/0133756 A1* | 5/2018 | Rothberg | G10K 11/18 |
| 2018/0186628 A1* | 7/2018 | Rothberg | B06B 1/0292 |
| 2018/0369862 A1* | 12/2018 | Alie | B81B 3/0078 |
| 2019/0202688 A1* | 7/2019 | Benaissa | H01L 21/76254 |
| 2019/0210869 A1* | 7/2019 | Rothberg | B06B 1/02 |
| 2019/0244933 A1* | 8/2019 | Or-Bach | G11C 11/5628 |
| 2019/0283081 A1* | 9/2019 | Rothberg | B06B 1/02 |
| 2019/0388935 A1* | 12/2019 | Rothberg | B06B 1/02 |
| 2020/0176420 A1* | 6/2020 | Or-Bach | H01L 25/50 |

OTHER PUBLICATIONS

French Preliminary Search Report dated Oct. 9, 2018 in French Application 17 63342, filed on Dec. 28, 2017 (with English Translation of Categories of Cited Documents & Written Opinion).

French Preliminary Search Report dated Oct. 9, 2018 in French Application 17 63342, filed Dec. 28, 2017 (with English Translation of Categories of Cited Documents & Written Opinion).

* cited by examiner

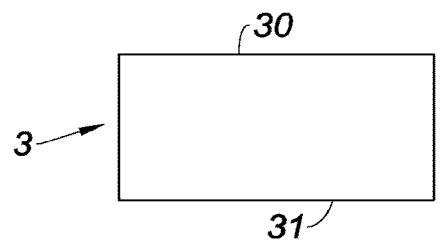
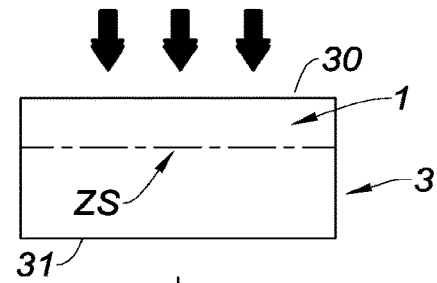
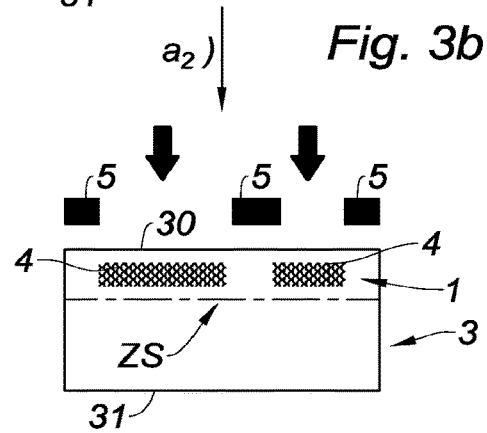
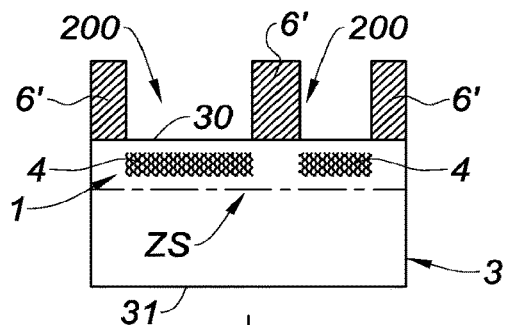
Fig. 3a
Fig. 3b
Fig. 3c
Fig. 3d
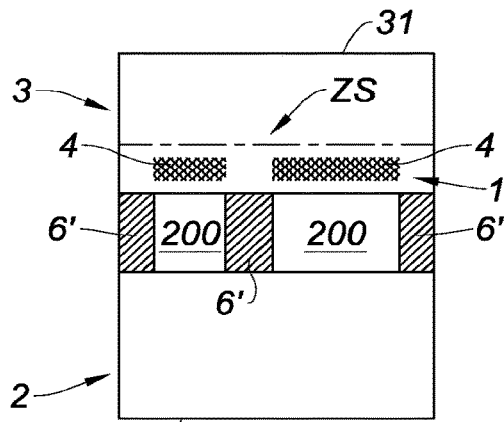
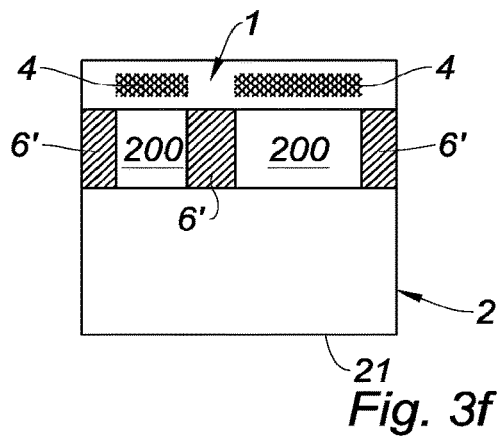
Fig. 3e
Fig. 3f

METHOD FOR TRANSFERRING A USEFUL LAYER INTO A SUPPORTING SUBSTRATE

TECHNICAL FIELD

The invention relates to the technical field of the transfer of a useful layer, belonging to a donor substrate, to a carrier substrate. The donor substrate and/or the carrier substrate is provided with at least one surface cavity.

The invention is in particular applicable to the fabrication of a membrane over the cavity, such as used for micromechanical systems (MEMS), for example in a pressure sensor, a resonator, a microphone or even a biochemical sensor. The transferred useful layer may also be used as a protective cover, for example for a component, or even as a hermetic encapsulating means.

PRIOR ART

One process known in the prior art, in particular from document C.-H. Yun et al., "Fabrication of Silicon and Oxide Membranes Over Cavities Using Ion-Cut Layer Transfer", Journal of Microelectromechanical Systems, vol. 9, no. 4, 474-477, 2000 (D1 below), is a process for transferring a useful layer to a carrier substrate, the carrier substrate including:
- a first surface and an opposite second surface,
- at least one cavity produced in the first surface;
the process including the successive steps of:
- a') providing a donor substrate including:
  - a first surface and an opposite second surface,
  - a weakened zone comprising implanted species,
  - the useful layer, which is bounded by the weakened zone and by the first surface of the donor substrate,
- b') assembling the donor substrate with the carrier substrate by bonding between the first surface of the donor substrate and the first surface of the carrier substrate;
- c') splitting the donor substrate along the weakened zone so as to reveal the useful layer.

Such a prior-art process allows a satisfactory control of the thickness of the transferred useful layer and a good uniformity in the thickness over the carrier substrate to be obtained. However, such a prior-art process is not entirely satisfactory in so far as D1 teaches that the thickness of the useful layer, denoted t, defines a maximum theoretical width of the cavity, denoted $W_{lim}$, that is proportional to $t^2$. In other words, for a given thickness t of the useful layer, a width of the cavity larger than $W_{lim}$ will lead to a failure of the useful layer transferred to the carrier substrate, which is related to blistering of the species implanted in the cavity.

Those skilled in the art would like, for a given thickness of the useful layer, to push back the limits on the maximum width of the cavity beyond which a failure of the useful layer transferred to the carrier substrate is observed.

SUMMARY OF THE INVENTION

The invention aims to remedy all or some of the aforementioned drawbacks. To this end, the subject of the invention is a process for transferring a useful layer to a carrier substrate including a first surface, the process including the successive steps of:
- a) providing a donor substrate including:
  - a first surface,
  - a weakened zone comprising implanted species,
  - the useful layer, which is bounded by the weakened zone and by the first surface of the donor substrate,
  - an amorphous zone lying, in the useful layer, parallel to the weakened zone;
- b) assembling, on the side of the first surface of the donor substrate and on the side of the first surface of the carrier substrate, the donor substrate with the carrier substrate by bonding; step b) being executed so that the amorphous zone is at least partially facing at least one cavity that is partially bounded by the first surface of the donor substrate;
- c) splitting the donor substrate along the weakened zone so as to reveal the useful layer.

Thus, such a process according to the invention allows, by virtue of the presence of such an amorphous zone, the limits on the maximum width of the cavity beyond which a failure of the useful layer transferred to the carrier substrate is observed to be pushed back. Specifically, such an amorphous zone allows the blistering of the implanted species, which is caused by the gas resulting from the recombination of said species, to be inhibited locally. In addition, this inhibition of the blistering of the implanted species allows a thin useful layer to be transferred, without fear of mechanical failure or even breakage thereof. The inhibition of the blistering of the implanted species is enhanced when the amorphous zone is located completely facing the cavity at the end of step b).

Furthermore, such an amorphous zone has a lower Young's modulus than a single-crystal structure (for example of about 20% lower for amorphous silicon with respect to single-crystal silicon), this allowing the risks of propagation of a crack during step c) to be decreased.

Moreover, the fact that the amorphous zone lies parallel to the weakened zone permits the splitting of the donor substrate carried out in step c) to be carried out parallel to the cavity.

Definitions

By "useful layer" what is meant is a layer from which a device may be formed to for any type of application, in particular electronic, mechanical and optical applications; or even a layer forming a protective cover.

By "substrate" what is meant is a self-supporting physical carrier made from a base material allowing an electronic device or an electronic component to be fabricated. A substrate is conventionally a wafer cut from a single-crystal ingot of semiconductor.

By "amorphous" what is meant is that the zone has a degree of mass crystallinity strictly lower than that of the donor substrate, the donor substrate possessing a single-crystal structure. Thus, the "amorphous" zone may have a polycrystalline structure (degree of mass crystallinity conventionally lower than or equal to 80%) or an amorphous structure (degree of mass crystallinity conventionally lower than or equal to 20%).

The term "parallel" must be understood to mean within the conventional tolerances of microelectronic fabrication techniques, and not in the mathematical sense of the term.

By "at least partially facing" what is meant is that all or some of the amorphous zone is located facing (i.e. plumb with) all or some of the cavity, with or without interposition of a section of useful layer. Thus, the expression covers the following cases:
  (i) all the amorphous zone is located facing all the cavity,
  (ii) all the amorphous zone is located facing a portion of the cavity, (iii) a portion of the amorphous zone is located facing all the cavity, (iv) a portion of the amorphous zone is located facing a portion of the cavity.

The method according to the invention may comprise one or more of the following features.

According to one feature of the invention, the cavity is produced in the first surface of the carrier substrate;

and the bonding of step b) is carried out between the first surface of the donor substrate and the first surface of the carrier substrate.

According to one feature of the invention, the carrier substrate includes pillars extending to the first surface of the carrier substrate and partially bounding the cavity;

and the bonding of step b) is carried out between the first surface of the donor substrate and the pillars of the carrier substrate.

According to one feature of the invention, the donor substrate provided in step a) includes pillars extending to the first surface of the donor substrate and partially bounding the cavity;

and the bonding in step b) is carried out between the pillars of the donor substrate and the first surface of the carrier substrate.

According to one feature of the invention, the carrier substrate includes pillars extending to the first surface of the carrier substrate and partially bounding a first cavity;

the donor substrate provided in step a) includes pillars extending to the first surface of the donor substrate and partially bounding a second cavity;

and the bonding of step b) is carried out between the pillars of the donor substrate and the pillars of the carrier substrate so as to join the first and second cavities and form the cavity.

According to one feature of the invention, the process includes a step d) consisting in recrystallizing the amorphous zone, step d) being executed after step c); step d) preferably being executed by solid-phase epitaxial regrowth.

Thus, in order to reconstruct the crystal structure of the useful layer, in step d) the amorphous zone is recrystallized from the crystalline material encircling the amorphous zone. Step d) is essential when it is desired to form an electronic device from the useful layer.

According to one feature of the invention, step a) includes the steps of:

$a_0$) providing the donor substrate including the first surface;
$a_1$) forming the weakened zone in the donor substrate;
$a_2$) forming the amorphous zone in the useful layer.
Steps $a_1$) and $a_2$) may be inverted.

According to one feature of the invention, step $a_1$) consists in implanting ionized species in the donor substrate, through the first surface of the donor substrate, said ionized species preferably including at least one species selected from $H^+$, $He^+$ and $B^+$.

According to one feature of the invention, step $a_2$) consists in implanting species in the useful layer, through the first surface of the donor substrate, said species preferably being silicon ions or germanium ions.

Thus, one procured advantage is to be able to easily obtain a "buried" amorphous zone, i.e. an amorphous zone located away from the first surface of the donor substrate, this not being conceivable with a deposition technique.

According to one feature of the invention, step $a_2$) is executed so that the amorphous zone lies at distance from the first surface of the donor substrate.

Thus, one advantage procured by such a buried amorphous zone, i.e. an amorphous zone that is closer to the weakened zone, is an improvement in the effectiveness of the inhibition of the blistering of the implanted species caused by the gas resulting from the recombination of said species. Furthermore, where appropriate, such a buried amorphous zone allows the quality of the recrystallization in step d) to be improved. Lastly, another advantage procured by such a buried amorphous zone is that it may be easily removed by sacrificial oxidation or thinning.

According to one feature of the invention, the useful layer of the donor substrate provided in step a) has a volume density, denoted $\rho_1$;

and step $a_2$) is executed so that the amorphous zone has a volume density, denoted $\rho_2$, satisfying $\rho_2 \geq \rho_1/10$.

Thus, one procured advantage is to improve the effectiveness of the inhibition of the blistering of the implanted species.

According to one feature of the invention, the useful layer of the donor substrate provided in step a) has a thickness, denoted t, defining a maximum theoretical width of the cavity, denoted $W_{lim}$, that is proportional to $t^2$;

and step $a_2$) is executed so that the amorphous zone forms a periodic array with a pitch, denoted p, satisfying $p<W_{lim}$, the periodic array lying parallel to the first surface of the donor substrate.

Thus, one advantage procured by such a periodic array is the ability to obtain an excellent inhibition of the blistering of the implanted species without requiring an amorphous zone to lie completely facing the cavity at the end of step b)—which would require an alignment, which may be tricky to achieve.

According to one feature of the invention, step c) is executed by applying a thermal anneal to the assembly obtained at the end of step b).

By "thermal anneal" what is meant is a heat treatment including a heating cycle with:
  a first phase of gradual increase in temperature to a plateau value,
  a second phase in which the heating temperature preserves the plateau value, and
  a cooling third phase.

The temperature of the thermal anneal is the plateau value of the heating temperature.

According to one feature of the invention, the donor substrate provided in step a) is made from a material selected from:
  a semiconductor, preferably Si, Ge, GaAs, InP or GaN;
  a piezoelectric material, preferably $LiNbO_3$, $LiTaO_3$.

By "semiconductor" what is meant is that the material has an electrical conductivity at 300 K comprised between $10^{-8}$ S/cm and $10^3$ S/cm.

BRIEF DESCRIPTION OF THE DRAWINGS

Other features and advantages will become apparent from the detailed description of various embodiments of the invention, the description being coupled with examples and references to the appended drawings.

FIGS. 3a to 3f are views of schematic cross sections cut along the normal to the first surfaces—and second surfaces—of the donor and carrier substrates, illustrating steps of a process according to the invention.

Figure 1A:
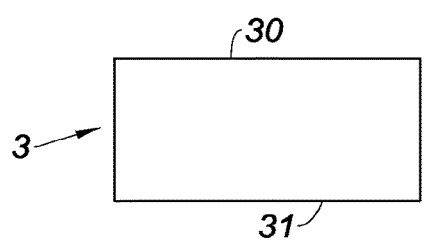
FIGS. 1a to 1g are views of schematic cross sections cut along the normal to the first surfaces—and second surfaces—of the donor and carrier substrates, illustrating steps of a process according to the invention.

The figures have not been drawn to scale in order to simplify comprehension thereof.

DETAILED DESCRIPTION OF EMBODIMENTS

Elements that are identical or that perform the same function in the various embodiments have been given the same references, for the sake of simplicity.

One subject of the invention is a process for transferring a useful layer 1 to a carrier substrate 2 including a first surface 20, the process including the successive steps of:
  a) providing a donor substrate 3 including:
    a first surface 30,
    a weakened zone ZS comprising implanted species,
    the useful layer 1, which is bounded by the weakened zone ZS and by the first surface 30 of the donor substrate 3,
    an amorphous zone 4 lying, in the useful layer 1, parallel to the weakened zone ZS;
  b) assembling, on the side of the first surface 30 of the donor substrate 3 and on the side of the first surface 20 of the carrier substrate 2, the donor substrate 3 with the carrier substrate 2 by bonding; step b) being executed so that the amorphous zone 4 is at least partially facing at least one cavity 200 that is partially bounded by the first surface 30 of the donor substrate 3;
  c) splitting the donor substrate 3 along the weakened zone ZS so as to reveal the useful layer 1.

Carrier Substrate

Figure 1B:
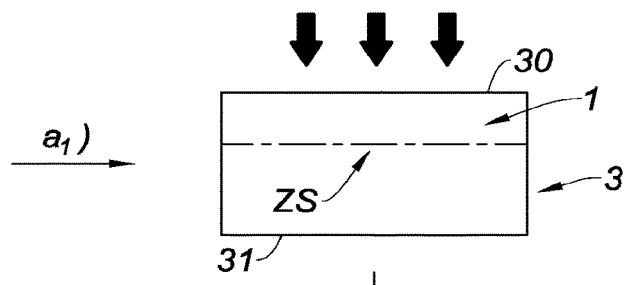
Figure 1D:
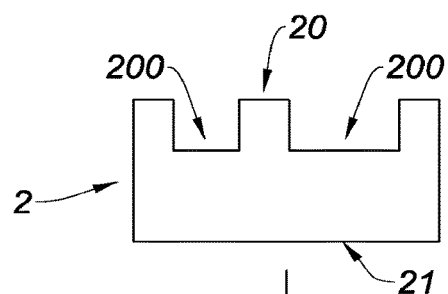

As illustrated in FIG. 1d, according to one embodiment, the one or more cavities 200 are formed in the first surface 20 of the carrier substrate 2, preferably by steps of photolithography and of etching. The carrier substrate 2 includes a second surface 21, opposite the first surface 20.

The first surface 20 of the carrier substrate 2 may be covered with an oxide layer. The oxide layer may be a thermal oxide. By way of variant, the first surface 20 of the carrier substrate 2 may be covered with a metal layer. The metal layer is made of a metal that is preferably selected from Au, Cu, Ti and W.

Donor Substrate

The donor substrate 3 provided in step a) includes a second surface 31, opposite to the first surface 30. The donor substrate 3 provided in step a) is advantageously made from a material selected from:
  a semiconductor, preferably Si, Ge, GaAs, InP or GaN;
  a piezoelectric material, preferably $LiNbO_3$, $LiTaO_3$.

When the first surface 20 of the carrier substrate 2 is covered with an oxide layer, the first surface 30 of the donor substrate 3 is advantageously covered with an oxide layer in order to promote hydrophilic bonding in step b). When the first surface 20 of the carrier substrate 2 is covered with a metal layer, the first surface 30 of the donor substrate 3 is advantageously covered with a metal layer, preferably of the same metal, in order to promote thermocompression bonding in step b).

The donor substrate 3 has a single-crystal structure.

Step a) advantageously includes the steps of:
  $a_0$) providing the donor substrate 3 including the first surface 30 and the opposite second surface 31;
  $a_1$) forming the weakened zone ZS in the donor substrate 3;
  $a_2$) forming the amorphous zone 4 in the useful layer 1.

Figure 1C:
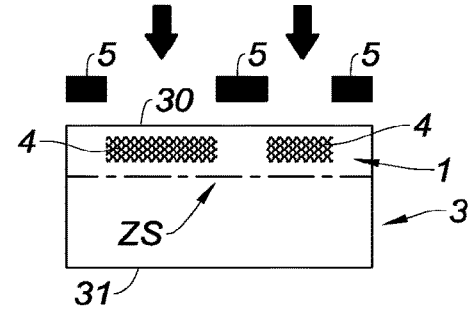

Steps $a_1$) and $a_2$) may be inverted. Step $a_0$) is illustrated in FIG. 1a. Step $a_1$) is illustrated in FIG. 1b. Step $a_2$) is illustrated in FIG. 1c.

Step $a_1$) advantageously consists in implanting ionized species in the donor substrate 3, through the first surface 30 of the donor substrate 3, said ionized species preferably including at least one species selected from $H^+$, $He^+$ and $B^+$. It is therefore possible to carry out a co-implantation with a plurality of ionized species (e.g. $H^+$ and $B^+$), or even to carry out a multi-implantation of the same ionized species. By way of nonlimiting example, when the donor substrate 3 is made of single-crystal silicon and when the implanted species are $H^+$ ions, step $a_1$) may be executed using the following parameters:
  an energy comprised between 60 keV and 200 keV,
  a dose comprised between $5 \times 10^{16}$ at·cm$^{-2}$ and $10^{17}$ at·cm$^{-2}$.

The parameters will be adapted depending on the thickness desired for the useful layer 1. For example, when the donor substrate 3 is made of single-crystal silicon, an energy of 160 keV and a dose of $6 \times 10^{16}$ at·cm$^{-2}$ lead to a thickness of 1.5 µm for the useful layer 1.

Step $a_2$) advantageously consists in implanting species in the useful layer 1, through the first surface 30 of the donor substrate 3, said species preferably being silicon ions or germanium ions. The species are implanted in step $a_2$) through a mask 5 (illustrated in FIG. 1c). The mask 5 may be a hard mask or a thick photoresist (of thickness of about 3 µm). Step $a_2$) is advantageously executed so that the amorphous zone 4 lies at distance from the first surface 30 of the donor substrate 3. By way of nonlimiting example, when the donor substrate 3 is made from single-crystal silicon and when the implanted species are silicon ions, step $a_2$) may be executed using the following parameters:
  an energy comprised between 10 keV and 150 keV,
  a dose comprised between $10^{14}$ at·cm$^{-2}$ and $5 \times 10^{15}$ at·cm$^{-2}$.

The parameters will be adapted depending on the desired amorphization depth.

According to one variant, step $a_2$) includes the steps of:
  $a_{20}$) etching a portion of the first surface 30 of the donor substrate 3;
  $a_{21}$) depositing an amorphous layer in said etched portion so as to form the amorphous zone 4.

The useful layer 1 of the donor substrate 3 provided in step a) has a volume density, denoted $\rho_1$. Step $a_2$) is advantageously executed so that the amorphous zone 4 has a volume density, denoted $\rho_2$, satisfying $\rho_2 \geq \rho_1/10$.

The useful layer 1 of the donor substrate 3 provided in step a) has a thickness, denoted t, defining a maximum theoretical width of the cavity, denoted $W_{lim}$, that is proportional to $t^2$, as described in D1. According to one embodiment, which is illustrated in FIG. 2, step $a_2$) is executed so that the amorphous zone 4 forms a periodic array with a pitch, denoted p, satisfying $p < W_{lim}$, the periodic array lying parallel to the first surface 30 of the donor substrate 3. By way of nonlimiting example, when the donor substrate 3 is made of single-crystal silicon, and when the thickness t of the useful layer 1 is about 1.5 µm, then $W_k$ is about 40 µm.

Step b) of Bonding

Figure 1E:
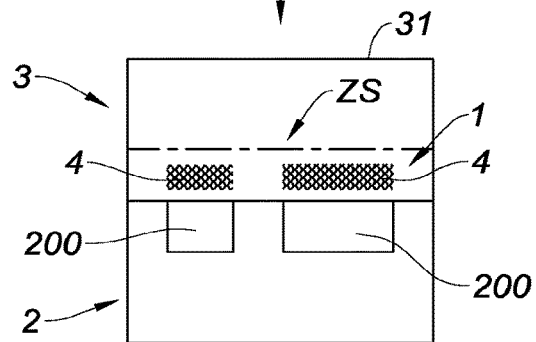

Step b) is illustrated in FIG. 1e. Steps $a_2$) and b) are configured so that the following cases may present themselves at the end of step b):
 (i) all the amorphous zone 4 is located facing all the cavity 200,
 (ii) all the amorphous zone 4 is located facing a portion of the cavity 200,
 (iii) a portion of the amorphous zone 4 is located facing all the cavity 200,
 (iv) a portion of the amorphous zone 4 is located facing a portion of the cavity 200.

Case (i) will be preferred in order to optimize the inhibition of the blistering of the implanted species.

When the one or more cavities 200 are produced in the first surface 20 of the carrier substrate 2, the bonding of step b) is carried out between the first surface 30 of the donor substrate 3 and the first surface 20 of the carrier substrate 2. When the carrier substrate 2 is provided with a single cavity 200, step b) is executed so that the amorphous zone 4 is at least partially facing the cavity 200. When the carrier substrate 2 is provided with a plurality of cavities 200, step b) is executed so that the amorphous zone 4 is at least partially facing each cavity 200.

The side of the first surface 30 of the donor substrate 3 is defined by the orientation of the normal to the first surface 30 of the donor substrate 3. In the same way, the side of the first surface 20 of the carrier substrate 2 is defined by the orientation of the normal to the first surface 20 of the carrier substrate 2.

As illustrated in FIG. 1e, at the end of step b), each cavity 200 is bounded:
 partially by the first surface 30 of the donor substrate 3,
 partially by the first surface 20 of the carrier substrate 2.

The bonding carried out in step b) is advantageously bonding by direct adhesion between the first surface 30 of the donor substrate 3 and the first surface 20 of the carrier substrate 2. By "direct adhesion", what is meant is spontaneous bonding resulting from bringing two surfaces into contact, i.e. in the absence of an additional element such as an adhesive, a wax or a solder. The adhesion mainly results from van der Waals forces due to the electronic interaction between the atoms or molecules of two surfaces, from hydrogen bonds because of preparation of the surfaces or from covalent bonds established between two surfaces. Bonding by molecular adhesion or direct bonding are also spoken of. Bonding by direct adhesion is to be contrasted with thermocompression bonding, eutectic bonding, or even anodic bonding.

However, the bonding carried out in step b) may be thermocompression bonding or eutectic bonding depending on the nature of the first surface 30 of the donor substrate 3 and of the first surface 20 of the carrier substrate 2.

Step b) is advantageously preceded by a preparation of the first surface 30 of the donor substrate 3 and by a preparation of the first surface 20 of the carrier substrate 2. By way of example, for direct bonding, it is possible to chemically activate the first surfaces 20, 30, for example using a Caro's acid (produced by mixing $H_2SO_4$ and $H_2O_2$), then to clean the first surfaces 20, 30 using a standard RCA process. By way of variant, for direct bonding, it is possible to activate the first surfaces 20, 30 by chemical-mechanical polishing (CMP), then to clean the first surfaces 20, 30 with a scrubber.

Step b) is advantageously executed in a controlled atmosphere. By way of nonlimiting example, step b) may be executed under a high vacuum such as a secondary vacuum at a pressure lower than $10^{-2}$ mbar.

Step c) of Splitting

Figure 1F:
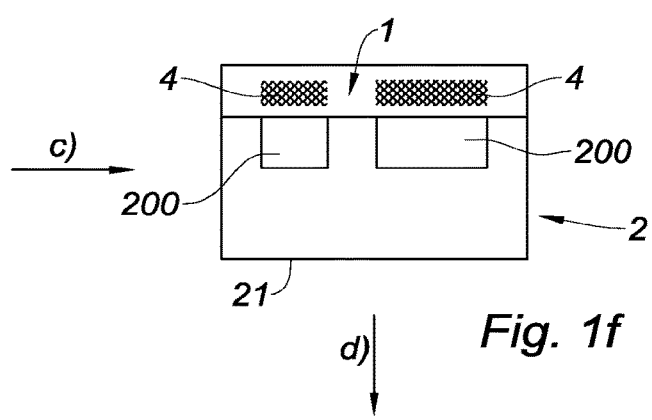

Step c) is illustrated in FIG. 1f. Step c) of splitting is advantageously executed by applying a thermal anneal to the assembly obtained at the end of step b).

The thermal anneal is applied with a thermal budget suitable for splitting the donor substrate 3 along the weakened zone ZS. The thermal-anneal temperature is preferably comprised between 350° C. and 550° C. The duration of the thermal anneal is preferably comprised between 5 minutes and 3 hours.

Step c) is advantageously preceded by a step consisting in applying a thermal anneal to the assembly obtained in step b) with a thermal budget suitable for strengthening the bonding without initiating the splitting of the donor substrate 3 along the weakened zone ZS.

Step d) of Recrystallizing

Figure 1G:
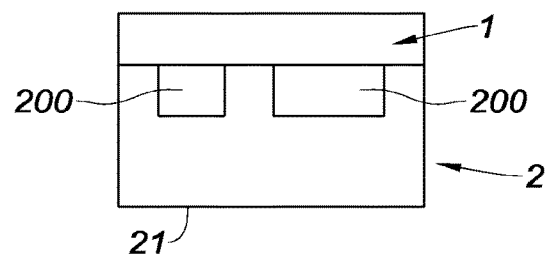

The process advantageously includes a step d) consisting in recrystallizing the amorphous zone 4, step d) being executed after step c). Step d) is illustrated in FIG. 1g. Step d) is advantageously executed by solid-phase epitaxial regrowth. Thus, one procured advantage is the ability to easily reconstruct a crystal structure for the useful layer 1. Step d) is essential when it is desired to form an electronic device from the useful layer 1. For this application, step $a_2$) is advantageously executed so that the amorphous zone 4 has a degree of mass crystallinity lower than or equal to 20%, this allowing the quality of the recrystallization to be improved. Step d) is executed by applying a thermal anneal. By way of nonlimiting example, when the amorphous zone 4 is of amorphous silicon, the recrystallization starts at 450° C.

By way of variant, step d) may be executed:
 using a rapid microwave thermal anneal, or
 using laser recrystallization.

Finishing

The process according to the invention advantageously includes:
 a step of sacrificial oxidation of the useful layer 1, which is executed after step d), so as to adjust the final thickness of the useful layer 1 and to remove portions damaged by the implantation of the ionized species;
 a step of chemical-mechanical polishing in order to improve the surface finish of the useful layer 1.

The method may also include steps of dry or wet etching, and steps of cleaning the useful layer 1.

Application to the Formation of a Protective Cover

Figure 2A:
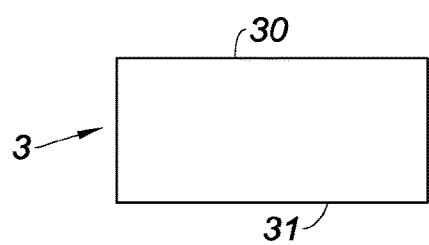
FIGS. 2a to 2f are views of schematic cross sections cut along the normal to the first surfaces—and second surfaces—of the donor and carrier substrates, illustrating steps of a process according to the invention.
Figure 2B:
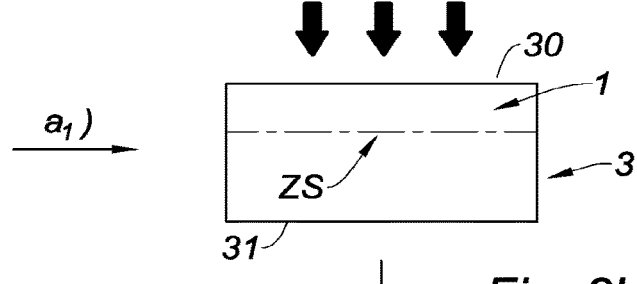
Figure 2D:
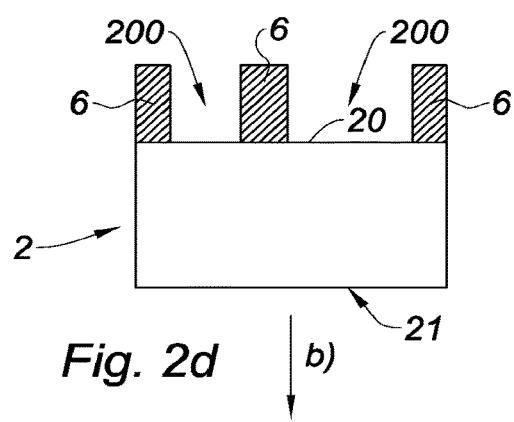
Figure 2C:
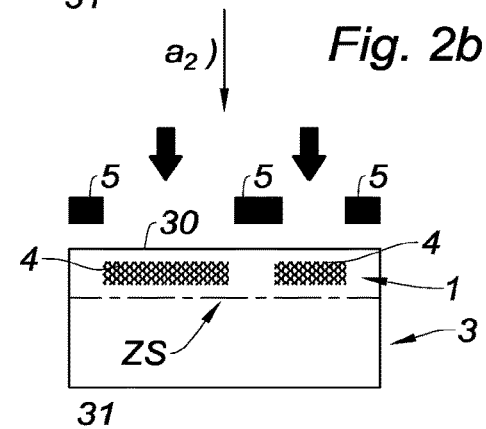
Figure 2E:
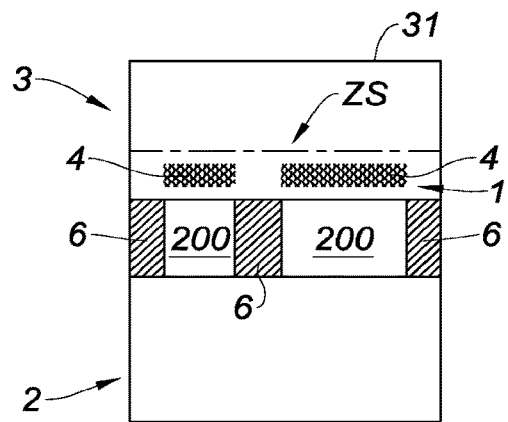
Figure 2F:
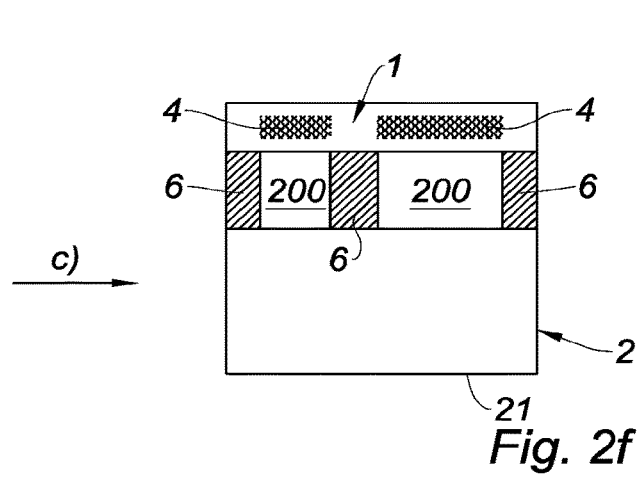

According to the embodiment illustrated in FIGS. 2a to 2f, the carrier substrate 2 includes pillars 6 extending to the first surface 20 of the carrier substrate 2 and partially bounding the cavity 200. The bonding of step b) is carried out between the first surface 30 of the donor substrate 3 and the pillars 6 of the carrier substrate 2. The pillars 6 of the carrier substrate 2 may partially bound a plurality of cavities 200. As illustrated in FIG. 2e, at the end of step b), each cavity 200 is bounded:
 partially by the first surface 30 of the donor substrate 3,
 partially by the first surface 20 of the carrier substrate 2,
 partially by the pillars 6 of the carrier substrate 2.

The technical features described above with respect to steps a), b) and c) apply to this subject matter, with the exception of the direct bonding of step b) which is not conceivable in this case. Step d) is optional. Specifically, when the useful layer 1 forms a protective cover, an electronic device is not necessarily formed from the useful layer 1. For this application, step $a_2$) may be executed so that the amorphous zone 4 has a degree of mass crystallinity lower than or equal to 80%. In other words, a polycrystalline structure of the amorphous zone 4 is perfectly recommendable provided that an electronic device does not need to be formed from the useful layer 1.

The pillars 6 are advantageously made from a metal, and preferably from copper. By way of nonlimiting example, the pillars 6 are formed in the first surface 20 of the carrier substrate 2 by electrochemical deposition (ECD). The bonding carried out in step b) is advantageously thermocompression bonding.

Thus, such a transferred useful layer 1 forms locally a, preferably hermetic, protective cover on the carrier substrate 2, so as to form an encapsulating means. Such a transferred useful layer 1 forms an encapsulating means that is more effective than an ad hoc, deposited, pierced then plugged layer.

By way of variant, as illustrated in FIGS. 3a to 3f, the donor substrate 3 provided in step a) includes pillars 6' extending to the first surface 30 of the donor substrate 3 and partially bounding the cavity 200. The bonding of step b) is carried out between the pillars 6' of the donor substrate 3 and the first surface 20 of the carrier substrate 2. The pillars 6' of the donor substrate 3 may partially bound a plurality of cavities 200. As illustrated in FIG. 3e, at the end of step b), each cavity 200 is bounded:
partially by the first surface 30 of the donor substrate 3,
partially by the first surface 20 of the carrier substrate 2,
partially by the pillars 6' of the donor substrate 3.

The technical features described above with respect to steps a), b) and c) apply to this subject matter, with the exception of the direct bonding of step b) which is not conceivable in this case. Step d) is optional. Specifically, when the useful layer 1 forms a protective cover, an electronic device is not necessarily formed from the useful layer 1. For this application, step $a_2$) may be executed so that the amorphous zone 4 has a degree of mass crystallinity lower than or equal to 80%. In other words, a polycrystalline structure of the amorphous zone 4 is perfectly recommendable provided that an electronic device does not need to be formed from the useful layer 1.

The pillars 6' are advantageously made from a metal, and preferably from copper. By way of nonlimiting example, the pillars 6' are formed in the first surface 30 of the donor substrate 3 by electrochemical deposition (ECD). The bonding carried out in step b) is advantageously thermocompression bonding.

Thus, such a transferred useful layer 1 forms locally a, preferably hermetic, protective cover on the carrier substrate 2, so as to form an encapsulating means. Such a transferred useful layer 1 forms an encapsulating means that is more effective than an ad hoc, deposited, pierced then plugged layer.

Figure 4A:
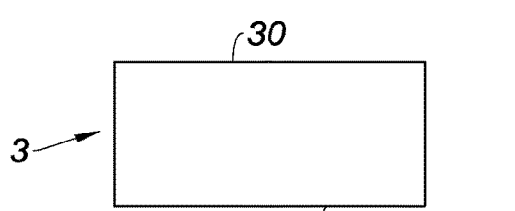
FIGS. 4a to 4g are views of schematic cross sections cut along the normal to the first surfaces—and second surfaces—of the donor and carrier substrates, illustrating steps of a process according to the invention.
Figure 4B:
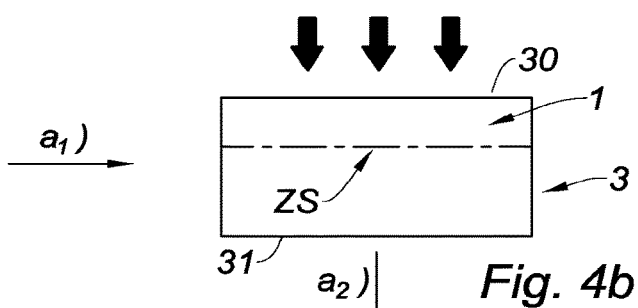
Figure 4D:
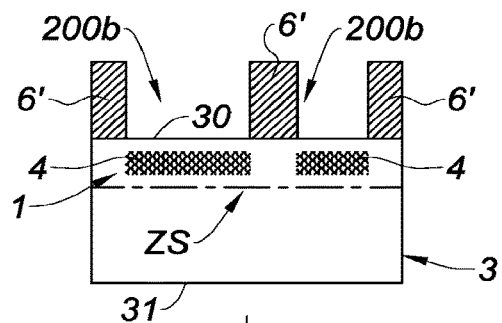
Figure 4C:
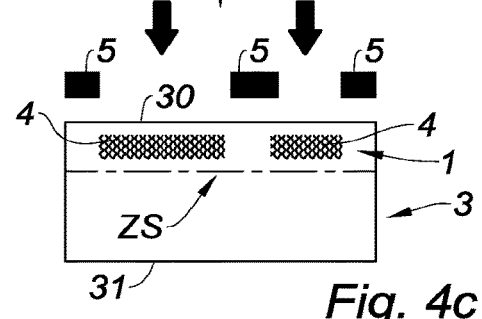
Figure 4E:
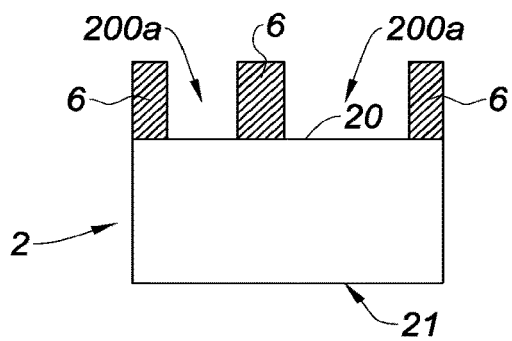
Figure 4F:
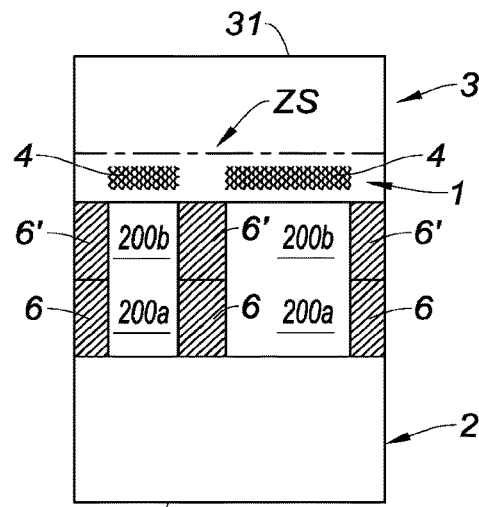
Figure 4G:
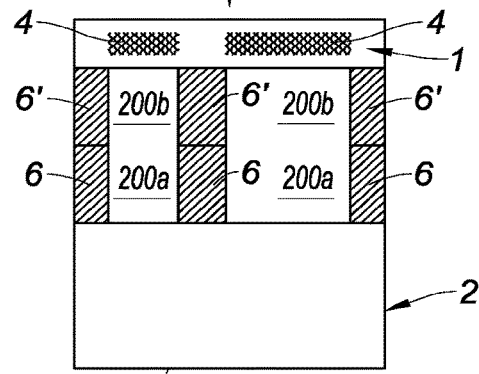
Figure 5:
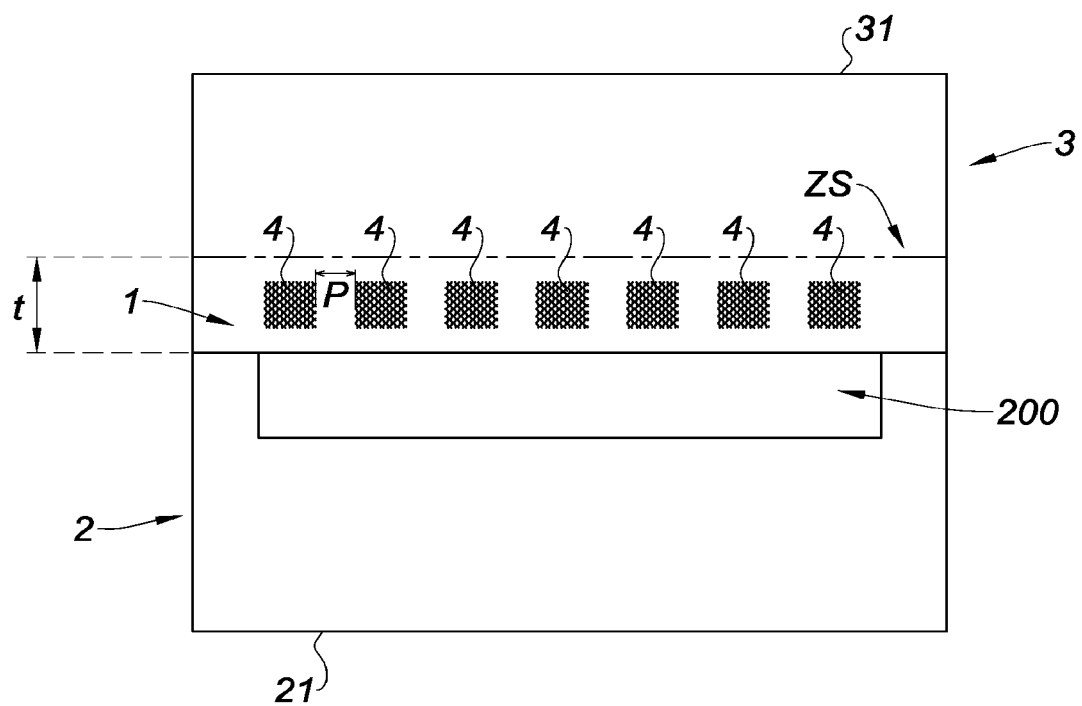
FIG. 5 is a view of a schematic cross section cut along the normal to the first surfaces—and second surfaces—of the donor and carrier substrates, illustrating an amorphous zone forming a periodic array.

By way of variant, as illustrated in FIGS. 4a to 4g, the carrier substrate 2 includes pillars 6 extending to the first surface 20 of the carrier substrate 2 and partially bounding a first cavity 200a. The donor substrate 3 provided in step a) includes pillars 6' extending to the first surface 30 of the donor substrate 3 and partially bounding a second cavity 200b. The bonding of step b) is carried out between the pillars 6' of the donor substrate 3 and the pillars 6 of the carrier substrate 2 so as to join the first and second cavities 200a, 200b and form the cavity 200. The pillars 6 of the carrier substrate 2 may partially bound a plurality of first cavities 200a. The pillars 6' of the donor substrate 3 may partially bound a plurality of second cavities 200b. Joining the first and second cavities 200a, 200b forms a plurality of cavities 200. As illustrated in FIG. 4f, at the end of step b), each cavity 200 is bounded:

partially by the first surface 30 of the donor substrate 3,
partially by the first surface 20 of the carrier substrate 2,
partially by the pillars 6' of the donor substrate 3,
partially by the pillars 6 of the carrier substrate 2.

The technical features described above with respect to steps a), b) and c) apply to this subject matter, with the exception of the direct bonding of step b) which is not conceivable in this case. Step d) is optional. Specifically, when the useful layer 1 forms a protective cover, an electronic device is not necessarily formed from the useful layer 1. For this application, step $a_2$) may be executed so that the amorphous zone 4 has a degree of mass crystallinity lower than or equal to 80%. In other words, a polycrystalline structure of the amorphous zone 4 is perfectly recommendable provided that an electronic device does not need to be formed from the useful layer 1.

The pillars 6 of the carrier substrate 2 and the pillars 6' of the donor substrate 3 are advantageously made from a metal, and preferably from copper. By way of nonlimiting example, the pillars 6 of the carrier substrate 2 and the pillars 6' of the donor substrate 3 are formed in the first surface 20 of the carrier substrate 2 and in the first surface 30 of the donor substrate 3 by electrochemical deposition (ECD) respectively. The bonding carried out in step b) is advantageously thermocompression bonding.

Thus, such a transferred useful layer 1 forms locally a, preferably hermetic, protective cover on the carrier substrate 2, so as to form an encapsulating means. Such a transferred useful layer 1 forms an encapsulating means that is more effective than an ad hoc, deposited, pierced then plugged layer.

The invention is not limited to the described embodiments. Those skilled in the art will be able to consider technically possible combinations thereof, and to substitute equivalents thereof.

The invention claimed is:

1. A process for transferring a useful layer to a carrier substrate including a first surface, the process comprising successive steps of:
   a) providing a donor substrate comprising a crystalline first material including:
      a first surface,
      a weakened zone comprising implanted species,
      the useful layer comprising a portion of the crystalline first material of the donor substrate bounded by the weakened zone and by the first surface of the donor substrate and having a first thickness of the crystalline first material in a direction from the first surface to the weakened zone, and
      an amorphous zone disposed, in the useful layer, parallel to the weakened zone and having a second thickness in the direction less than the first thickness;
   b) assembling, on a side of the first surface of the donor substrate and on a side of the first surface of the carrier substrate, the donor substrate with the carrier substrate by bonding, step b) being executed such that the amorphous zone is at least partially facing at least one cavity that is partially bounded by the first surface of the donor substrate; and
   c) splitting the donor substrate along the weakened zone so as to reveal the useful layer.

2. The process according to claim 1,
   wherein the at least one cavity is produced in the first surface of the carrier substrate, and
   wherein the bonding of step b) is carried out between the first surface of the donor substrate and the first surface of the carrier substrate.

3. The process according to claim 1,
wherein the carrier substrate includes pillars extending to the first surface of the carrier substrate and partially bounding the cavity, and
wherein the bonding of step b) is carried out between the first surface of the donor substrate and the pillars of the carrier substrate.

4. The process according to claim 1,
wherein the donor substrate provided in step a) includes pillars extending to the first surface of the donor substrate and partially bounding the cavity, and
wherein the bonding of step b) is carried out between the pillars of the donor substrate and the first surface of the carrier substrate.

5. The process according to claim 1,
wherein the carrier substrate includes pillars extending to the first surface of the carrier substrate and partially bounding a first cavity,
wherein the donor substrate provided in step a) includes pillars extending to the first surface of the donor substrate and partially bounding a second cavity, and
wherein the bonding of step b) is carried out between the pillars of the donor substrate and the pillars of the carrier substrate so as to join the first and second cavities and form said at least one cavity.

6. The process according to claim 1, further comprising a step d) consisting of crystallizing the amorphous zone, with step d) being executed after step c).

7. The process according to claim 6, wherein step d) is executed by solid-phase epitaxial regrowth.

8. The process according to claim 1, wherein step a) includes the steps of:
$a_0$) providing the donor substrate including the first surface,
$a_1$) forming the weakened zone in the donor substrate, and
$a_2$) forming the amorphous zone in the useful layer.

9. The process according to claim 8, wherein step $a_1$) consists of implanting ionized species in the donor substrate, through the first surface of the donor substrate.

10. The process according to claim 9, wherein the ionized species includes at least one species selected from among $H^+$, $He^+$, and $B^+$.

11. The process according to claim 8, wherein step $a_2$) consists of implanting species in the useful layer, through the first surface of the donor substrate.

12. The process according to claim 11, wherein the species includes silicon ions or germanium ions.

13. The process according to claim 8, wherein step $a_2$) is executed such that the amorphous zone is disposed at a distance from the first surface of the donor substrate.

14. The process according to claim 8,
wherein the useful layer of the donor substrate provided in step a) has a volume density, denoted $\rho_1$, and
wherein step $a_2$) is executed such that the amorphous zone has a volume density, denoted $\rho_2$, satisfying $\rho_2 \geq \rho_1/10$.

15. The process according to claim 8,
wherein the thickness of useful layer of the donor substrate provided in step a) is denoted t, defining a maximum theoretical width of the at least one cavity, denoted $W_{lim}$, that is proportional to $t^2$, and
wherein step $a_2$) is executed such that the amorphous zone forms a periodic array of zones with a pitch between the zones, denoted p, satisfying $p < W_{lim}$, the periodic array being disposed parallel to the first surface of the donor substrate.

16. The process according to claim 8, wherein step $a_2$) is executed by one of implantation of a species into the crystalline first material of the useful layer and deposition of an amorphous material in the crystalline first material of the donor substrate.

17. The process according to claim 1, wherein step c) is executed by applying a thermal anneal after the assembling of step b).

18. The process according to claim 1, wherein the useful layer comprises the crystalline first material and the amorphous zone is entirely disposed within boundaries of the useful layer.

19. A process for transferring a useful layer to a carrier substrate including a first surface, the process comprising successive steps of:
a) providing a donor substrate made from a first material selected from a crystalline semiconductor and a piezoelectric material including:
a first surface,
a weakened zone comprising implanted species,
the useful layer, which is bounded by the weakened zone and by the first surface of the donor substrate, is comprised of the first material, and has a first thickness in a direction from the first surface to the weakened zone, and
an amorphous zone disposed, in the useful layer, parallel to the weakened zone and having a second thickness less than the first thickness;
b) assembling, on a side of the first surface of the donor substrate and on a side of the first surface of the carrier substrate, the donor substrate with the carrier substrate by bonding, step b) being executed such that the amorphous zone is at least partially facing at least one cavity that is partially bounded by the first surface of the donor substrate; and
c) splitting the donor substrate along the weakened zone so as to reveal the useful layer.

20. The process according to claim 19,
wherein the semiconductor is selected from among Si, Ge, GaAs, InP, and GaN, and
wherein the piezoelectric material is selected from among $LiNbO_3$ and $LiTaO_3$.

21. The process according to claim 19, wherein the first material of the donor substrate is a single crystal material.

22. A process for transferring a useful layer to a carrier substrate including a first surface, the process comprising successive steps of:
a) providing a donor substrate comprising a crystalline first material including:
a first surface,
a weakened zone comprising implanted species,
the useful layer comprising a portion of the crystalline first material of the donor substrate bounded by the weakened zone and by the first surface of the donor substrate, and
an amorphous zone disposed, in the useful layer, parallel to the weakened zone;
b) assembling, on a side of the first surface of the donor substrate and on a side of the first surface of the carrier substrate, the donor substrate with the carrier substrate by bonding, step b) being executed such that the amorphous zone is at least partially facing a plurality of cavities that are each partially bounded by the first surface of the donor substrate; and
c) splitting the donor substrate along the weakened zone so as to reveal the useful layer, wherein the amorphous zone comprises a plurality of zones each being formed to be surrounded by the crystalline first material, and each partially facing one of the plurality of cavities.

* * * * *